US012610812B2

(12) United States Patent
Guo

(10) Patent No.: US 12,610,812 B2
(45) Date of Patent: Apr. 21, 2026

(54) SEMICONDUCTOR STRUCTURE, FABRICATION METHOD FOR SEMICONDUCTOR STRUCTURE AND MEMORY

(71) Applicant: CHANGXIN MEMORY TECHNOLOGIES, INC., Hefei City (CN)

(72) Inventor: Shuai Guo, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 385 days.

(21) Appl. No.: 18/448,906

(22) Filed: Aug. 11, 2023

(65) Prior Publication Data

US 2024/0006319 A1     Jan. 4, 2024

Related U.S. Application Data

(63) Continuation of application No. PCT/CN2021/126359, filed on Oct. 26, 2021.

(30) Foreign Application Priority Data

Sep. 27, 2021    (CN) .......................... 202111135789.9

(51) Int. Cl.
*H10W 20/44*     (2026.01)
*H10W 20/00*     (2026.01)
(52) U.S. Cl.
CPC ..... *H10W 20/4403* (2026.01); *H10W 20/037* (2026.01); *H10W 20/056* (2026.01)

(58) Field of Classification Search
None
See application file for complete search history.

(56) References Cited

U.S. PATENT DOCUMENTS

| | | | |
|---|---|---|---|
| 10,354,956 B1 | 7/2019 | Yu | |
| 2019/0214344 A1 | 7/2019 | Yu | |
| 2020/0006541 A1* | 1/2020 | Lin | ..................... H01L 21/0259 |
| 2020/0194447 A1 | 6/2020 | Sun | |
| 2021/0265375 A1 | 8/2021 | Sun | |
| 2021/0359099 A1* | 11/2021 | Shen | ...................... B82Y 10/00 |

(Continued)

FOREIGN PATENT DOCUMENTS

| | | |
|---|---|---|
| CN | 108447870 A | 8/2018 |
| CN | 109716521 A | 5/2019 |

(Continued)

OTHER PUBLICATIONS

International Search Report in the international application No. PCT/CN2021/126359, mailed on May 25, 2022. 5 pages with English translation.

*Primary Examiner* — Erik Kielin
(74) *Attorney, Agent, or Firm* — Syncoda LLC; Feng Ma

(57) ABSTRACT

A semiconductor structure includes a base provided with a conductive contact hole, a metal sulfide layer formed in the conductive contact hole and covering a bottom wall of the conductive contact hole, a semi-metal layer formed on a surface of the metal sulfide layer, a barrier layer covering a surface of the semi-metal layer and a sidewall of the conductive contact hole and a conductive contact structure disposed in an accommodation hole delimited by the barrier layer.

16 Claims, 12 Drawing Sheets

(56) References Cited

U.S. PATENT DOCUMENTS

| | | | | |
|---|---|---|---|---|
| 2022/0416051 A1* | 12/2022 | Wang | ..................... | H10D 64/01 |
| 2023/0328952 A1* | 10/2023 | Guo | .................... | H10B 12/033 |

FOREIGN PATENT DOCUMENTS

| | | | |
|---|---|---|---|
| CN | 110148598 A | 8/2019 |
| CN | 109004054 B | 4/2020 |
| CN | 112670239 A | 4/2021 |

* cited by examiner

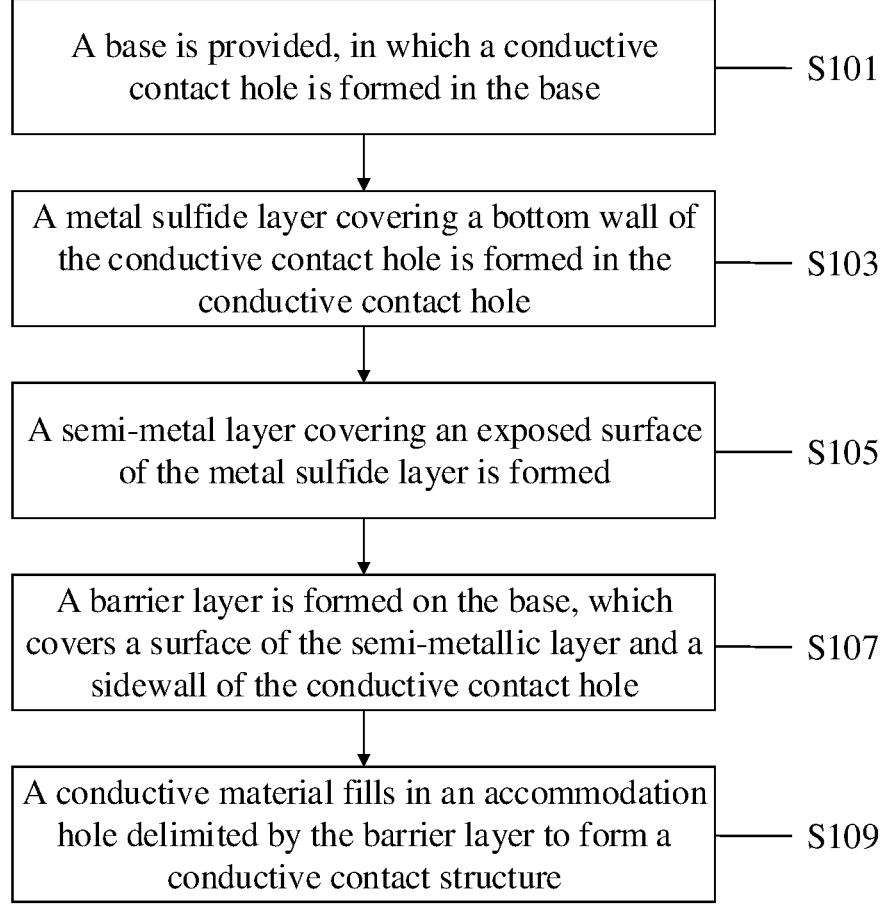

| | |
|---|---|
| A base is provided, in which a conductive contact hole is formed in the base | —— S101 |
| A metal sulfide layer covering a bottom wall of the conductive contact hole is formed in the conductive contact hole | —— S103 |
| A semi-metal layer covering an exposed surface of the metal sulfide layer is formed | —— S105 |
| A barrier layer is formed on the base, which covers a surface of the semi-metallic layer and a sidewall of the conductive contact hole | —— S107 |
| A conductive material fills in an accommodation hole delimited by the barrier layer to form a conductive contact structure | —— S109 |

FIG. 2

SEMICONDUCTOR STRUCTURE, FABRICATION METHOD FOR SEMICONDUCTOR STRUCTURE AND MEMORY

CROSS-REFERENCE TO RELATED APPLICATIONS

This is a continuation of International Application No. PCT/CN2021/126359 filed on Oct. 26, 2021, which claims priority to Chinese Patent Application No. 202111135789.8 filed on Sep. 27, 2021. The disclosures of the above-referenced applications are hereby incorporated by reference in their entirety.

BACKGROUND

With the development of the semiconductor industry, due to the continuous reduction of line width, when metal is in contact with semiconductor, the Schottky barrier and the metal-induced gap state lead to excessive contact resistance, such that the current cannot meet working requirements of a device.

Therefore, how to reduce the contact resistance has become an urgent problem to be solved for those skilled in the art.

SUMMARY

The disclosure relates to the technical field of semiconductor fabrication, in particular to a semiconductor structure, a fabrication method for a semiconductor structure and a memory.

Embodiments of the disclosure are proposed to provide a semiconductor structure, a fabrication method for a semiconductor structure and a memory.

According to the first aspect of the embodiments of the disclosure, a semiconductor structure is provided. The semiconductor structure includes a base, a metal sulfide layer, a semi-metal layer, a barrier layer and a conductive contact structure. The base is provided with a conductive contact hole.

The metal sulfide layer is formed in the conductive contact hole and covers a bottom wall of the conductive contact hole.

The semi-metal layer is formed on an exposed surface of the metal sulfide layer.

The barrier layer covers a surface of the semi-metal layer and a sidewall of the conductive contact hole.

The conductive contact structure is disposed in an accommodation hole delimited by the barrier layer.

According to the second aspect of the embodiments of the disclosure, a fabrication method for a semiconductor structure is provided, which includes the following operations.

A base is provided, in which a conductive contact hole is formed in the base.

A metal sulfide layer covering a bottom wall of the conductive contact hole is formed in the conductive contact hole.

A semi-metal layer covering an exposed surface of the metal sulfide layer is formed.

A barrier layer is formed on the base, which covers a surface of the semi-metallic layer and a sidewall of the conductive contact hole.

A conductive material fills an accommodation hole delimited by the barrier layer, to form a conductive contact structure.

Etching back processEtching back processAccording to the third aspect of the embodiments of the disclosure, a memory is provided. The memory includes the semiconductor structure according to the above embodiments.

BRIEF DESCRIPTION OF THE DRAWINGS

In order to more clearly illustrate the technical solution in embodiments of the disclosure or conventional techniques, the drawings used for the description of the embodiments or the conventional techniques will be briefly described below. It will be apparent that the drawings described below are only some embodiments of the disclosure, from which other drawings may be obtained without creative effort by a person of ordinary skill in the art.

FIG. 2 is a flowchart of a fabrication method for a semiconductor structure according to an exemplary embodiment.

DETAILED DESCRIPTION

In order to facilitate the understanding of the disclosure, a more complete description will be given below with reference to the relevant drawings. Embodiments of the disclosure are given in the accompanying drawings. However, the disclosure may be implemented in many different forms and is not limited to the embodiments described herein. Rather, these embodiments are provided to make the disclosure more thorough and comprehensive.

Unless otherwise defined, all technical and scientific terms used herein have the same meanings as are commonly understood by those skilled in the art of the disclosure. Terms used herein in the specification of the disclosure are for the purpose of describing specific embodiments only, and are not intended to limit the disclosure.

As used herein, the singular forms of "a/an", "one" and "said/the" include the plural forms as well, unless the context clearly indicates otherwise. It should be understood that the terms "comprise/include/contain" or "have" and the like refer to the existence of the stated features, integers, steps, operations, components, parts, or combination thereof, but do not exclude the possibility of the existence or addition of one or more other features, integers, steps, operations, components, parts, or combination thereof.

Meanwhile, the term "and/or" used in the specification includes any and all combinations of related listed items.

With the development of the semiconductor industry, due to the continuous reduction of line width, when metal is in contact with semiconductor, the Schottky barrier and the metal-induced gap state lead to excessive contact resistance, such that the current cannot meet working requirements of a device.

Therefore, how to reduce the contact resistance has become an urgent problem to be solved for those skilled in the art.

Figure 1:
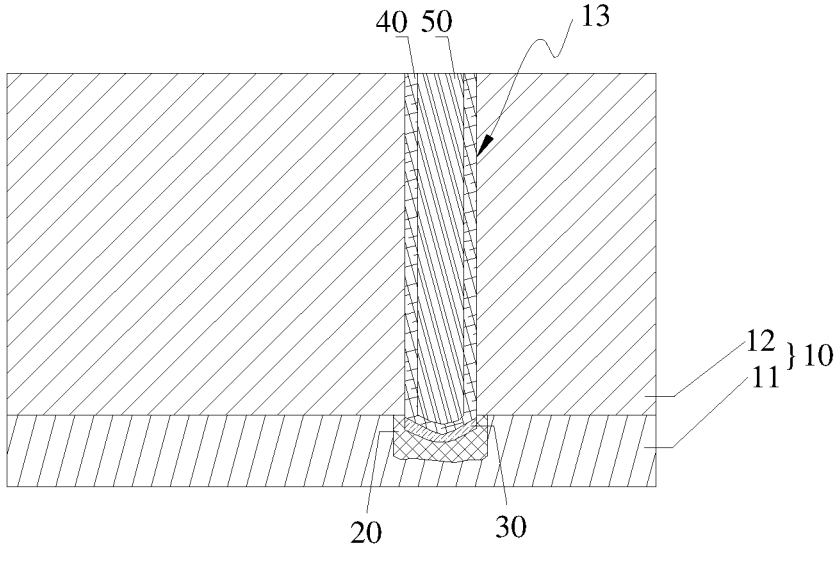
FIG. 1 is a first structural diagram of semiconductor structures according to an exemplary embodiment.

In embodiments of the disclosure, a semiconductor structure is provided. Referring to FIG. 1, the semiconductor structure includes a base 10, a metal sulfide layer 20, a semi-metal layer 30, a barrier layer 40, and a conductive contact structure 50. The conductive contact hole 13 is formed in the base 10. The metal sulfide layer 20 is formed in the conductive contact hole 13 and covers a bottom wall of the conductive contact hole 13. The semi-metal layer 30 is formed on an exposed surface of the metal sulfide layer 20. The barrier layer 40 covers a surface of the semi-metal layer 30 and a sidewall of the conductive contact hole 13. The conductive contact structure 50 is disposed in an accommodation hole delimited by the barrier layer 40.

In the embodiments of the disclosure, the Fermi energy level of the semi-metal layer 30 is higher than the minimum of the conduction band of the metal sulfide layer 20. The pz orbit of the semi-metal layer 30 resonates with the pz and dz2 orbits of the metal sulfide layer 20. The distribution of inductive electric dipoles at the contact interface between the semi-metal layer 30 and the metal sulfide layer 20 falls into the van der Waals gap. The metal-induced gap state of the metal sulfide layer 20 is electron saturated, such that the gap state of the metal sulfide layer 20 are saturated, the zero Schottky barrier is achieved at the contact interface between the semi-metal layer 30 and the metal sulfide layer 20, and the ohmic contact is formed at the contact interface between the semi-metal layer 30 and the metal sulfide layer 20. Therefore, the semi-metal layer 30 and the metal sulfide layer 20 have the good ohmic contact, which reduces the contact resistance of the semiconductor structure and the RC delay.

Figure 3:
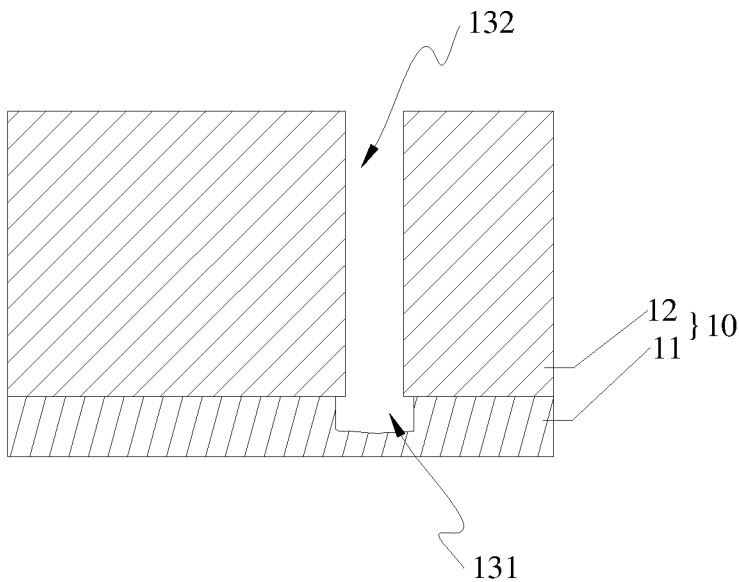
FIG. 3 is a second structural diagram of semiconductor structures according to an exemplary embodiment.

In some embodiments, the base 10 may be treated by an etching process to form the conductive contact hole 13 in the base 10 (specifically referring to FIG. 3). In some embodiments, the conductive contact hole 13 may be formed in the base 10 by dry etching.

In some embodiments, the base 10 includes a substrate 11 and a first dielectric layer 12 formed on the substrate 11. The conductive contact hole 13 penetrates the first dielectric layer 12 and extends into the substrate 11. The substrate 11 may adopt any substrate 11 in related art as needed. The structure and material of the substrate 11 may also be adapted as needed. For example, the material of the substrate 11 may be one or any combination of silicon, germanium, silicon germanium, silicon carbide, gallium arsenide, indium gallium, silicon on insulator (SOI), or germanium on insulator (GOI).

The conductive contact hole 13 includes a first conductive hole 131 formed in the substrate 11 and a second conductive hole 132 formed in the first dielectric layer 12 (specifically referring to FIG. 3). The first conductive hole 131 is interconnected with the second conductive hole 132, and the radial dimension of the first conductive hole 131 is larger than the radial dimension of the second conductive hole 132. With reference to FIG. 1, the metal sulfide layer 20 is disposed in the first conductive hole 131; the formed metal sulfide layer 20 covers the bottom wall and the sidewall of the first conductive hole 131; and the semi-metal layer 30 is disposed on the upper surface of the metal sulfide layer 20. With continuous reference to FIG. 1, the semi-metal layer 30 is disposed between the metal sulfide layer 20 and the barrier layer 40, and a part of the structure of the metal sulfide layer 20 is connected with a lower surface of the first dielectric layer 12.

In the embodiments of the disclosure, the radial dimension of the first conductive hole 131 is set to be larger than the radial dimension of the second conductive hole 132 to increase a contact area between the semi-metal layer 30 and the metal sulfide 20, thereby further reducing the contact resistance.

In some embodiments, the material of the metal sulfide layer 20 is molybdenum sulfide or tungsten sulfide, and the material of the semi-metal layer 30 contains a semi-metal element of Group VA. The material of semi-metal layer 30 includes Bi, Sb or As.

In some embodiments, the material of the metal sulfide layer 20 is molybdenum sulfide; and the material of the semi-metal layer 30 is bismuth (Bi).

In the embodiment of the disclosure, the Fermi energy level of bismuth is higher than the minimum of the conduction band of molybdenum disulfide. The pz orbital of bismuth resonates with the pz and dz2 orbitals of molybdenum disulfide. The distribution of inductive electric dipoles at a contact interface between bismuth and molybdenum disulfide falls into the van der Waals gap. The metal-induced gap state of molybdenum disulfide is electron saturated, such that, the gap state of molybdenum disulfide are saturated, the zero Scotty barrier is achieved at the contact interface between bismuth and molybdenum disulfide, and the ohmic contact is formed at the contact interface between bismuth and molybdenum disulfide.

In some embodiments, the material of the barrier layer 40 includes, but is not limited to, titanium nitride.

In some embodiments, the material of the conductive contact structure includes, but is not limited to, tungsten.

Figure 12:
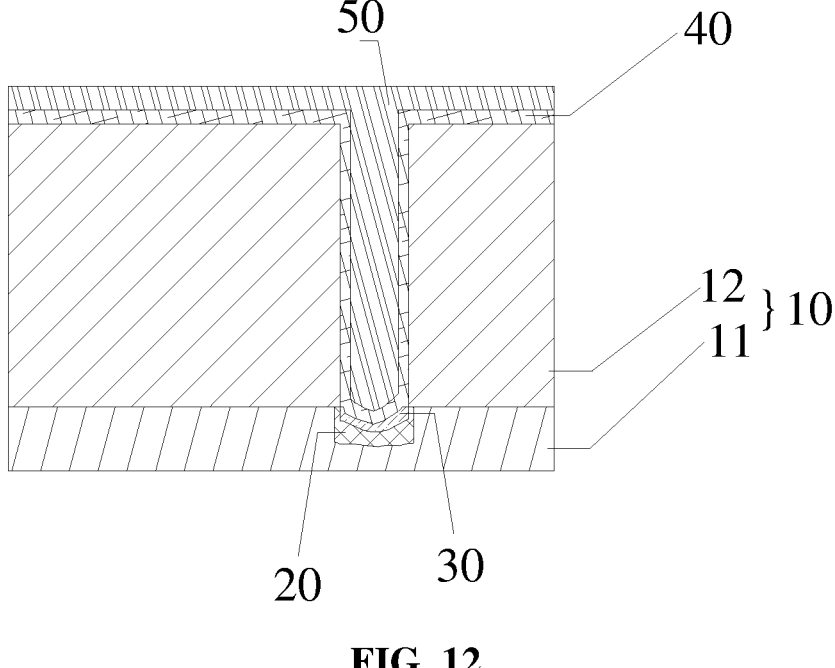
FIG. 12 is an eleventh structural diagram of semiconductor structures according to an exemplary embodiment.

In some embodiments, the provided barrier layer 40 covers a surface of the semi-metal layer 30 and a sidewall of the conductive contact hole 13. With reference to FIG. 12, the barrier layer 40 is formed on an innerwall of the second conductive hole 132 and a surface of the semi-metal layer 30 facing away from the metal sulfide layer 20. With continuous reference to FIG. 12, the provided barrier layer 40 extends from an opening of the conductive contact hole 13 to an outer edge of the base 10, so as to cover the upper surface of the base 10. It is to be understood that, the opening of the conductive contact hole 13 is specifically the opening of the second conductive hole 132 formed at the upper surface of the first dielectric layer 12. The provided barrier layer 40 extends toward the outer edge of the base 10 at the opening to cover the upper surface of the first dielectric layer 12.

In some embodiments, the provided conductive contact structure 50 fills the accommodation hole 41 (which is specifically shown in FIG. 11) and extends from an opening of the accommodation hole 41 toward the outer edge of the base 10 to cover an upper surface of the barrier layer 40. It is to be understood that the opening of the accommodation hole 41 is disposed at the upper surface of the first dielectric layer 12. The provided conductive contact structure 50 extends toward the outer edge of the base 10 at the opening to cover the upper surface of the barrier layer 40.

Figure 7:
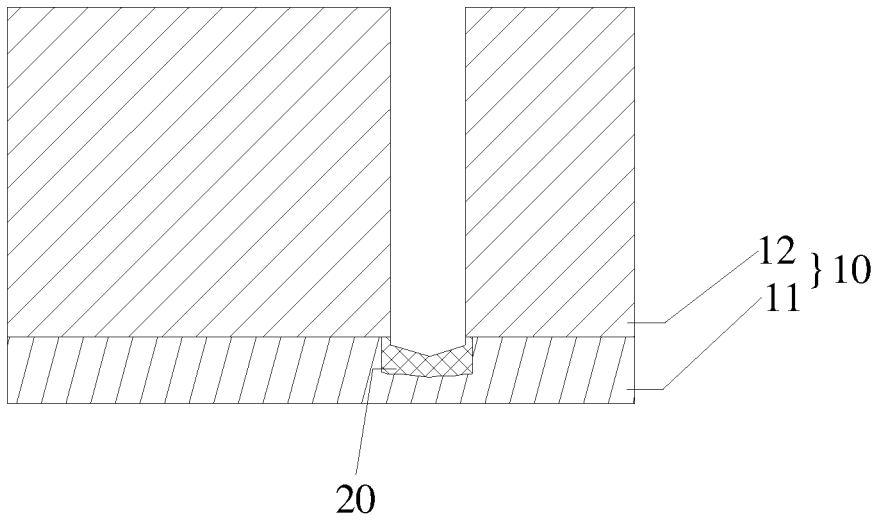
FIG. 7 is a sixth structural diagram of semiconductor structures according to an exemplary embodiment.

In some embodiments, with reference to FIG. 7, the radial dimension of the metal sulfide layer 20 is larger than the radial dimension of the conductive contact structure. In the embodiments of the disclosure, a removal process is performed on the metal sulfide layer 20 to form a concave morphology on the upper surface of the metal sulfide layer 20.

In the embodiments of the disclosure, the process of forming the concave morphology is performed on the upper surface of the metal sulfide layer 20, such that a contact area between the semi-metal layer 30 and the barrier layer 40 or between the barrier layer 40 and the conductive contact structure 50 is increased, thereby further reducing the contact resistance.

With reference to FIGS. 1 and 2, according to the second aspect of the embodiments of the disclosure, a fabrication method for a semiconductor structure is provided, which includes the following operations.

In S101, a base 10 is provided, in which a conductive contact hole 13 is formed in the base 10.

In S103, a metal sulfide layer 20 covering a bottom wall of the conductive contact hole 13 is formed in the conductive contact hole 13.

In S105, a semi-metal layer 30 covering an exposed surface of the metal sulfide layer 20 is formed.

In S107, a barrier layer 40 is formed on the base 10, which covers a surface of the semi-metal layer 30 and a sidewall of the conductive contact hole 13.

In S109, a conductive material fills in an accommodation hole delimited by the barrier layer 40, so as to form a conductive contact structure 50.

In the embodiments of the disclosure, the Fermi energy level of the semi-metal layer 30 is higher than the minimum of the conduction band of the metal sulfide layer 20. The pz orbital of the semi-metal layer 30 resonates with the pz and dz2 orbitals of the metal sulfide layer 20. The distribution of inductive electric dipoles at a contact interface between the semi-metal layer 30 and the metal sulfide layer 20 falls into the van der Waals gap. The metal-induced gap state of the metal sulfide layer 20 is electron saturated, such that the gap state of the metal sulfide layer 20 are saturated, the zero Schottky barrier is achieved at the contact interface between the semi-metal layer 30 and the metal sulfide layer 20, and the ohmic contact is formed at the contact interface between the semi-metal layer 30 and the metal sulfide layer 20. Therefore, the semi-metal layer 30 and the metal sulfide layer 20 have the good ohmic contact, which reduces the overall resistance of the semiconductor structure.

In some embodiments, in S101, forming a conductive contact hole 13 in the base 10 includes the following operations.

The base 10 is treated by an etching process to form the conductive contact hole 13 on the base 10. In some embodiments, the conductive contact hole 13 may be formed in the base 10 by dry etching. Reference is made to FIG. 3, which illustrates the conductive contact hole 13 formed in the base.

In some embodiments, the base 10 includes a substrate 11 and a first dielectric layer 12 formed on the substrate 11. The formed conductive contact hole 13 penetrates the first dielectric layer 12 and extends into the substrate 11, so as to expose a surface of the substrate 11. The substrate 11 may adopt any substrate 11 in related art as needed. The structure and the material of the substrate 11 may also be adapted as needed. For example, the material of the substrate 11 may be one or any combination of silicon, germanium, silicon germanium, silicon carbide, gallium arsenide, indium gallium, silicon on insulator (SOI), or germanium on insulator (GOI).

With continuous reference to FIG. 3, the conductive contact hole 13 includes a first conductive hole 131 formed in the substrate 11 and a second conductive hole 132 formed in the first dielectric layer 12. The first conductive hole 131 is interconnected with the second conductive hole 132; and the radial dimension of the first conductive hole 131 is larger than the radial dimension of the second conductive hole 132. With reference to FIG. 1, the metal sulfide layer 20 is disposed in the first conductive hole 131. The formed metal sulfide layer 20 covers the bottom wall and the sidewall of the first conductive hole 131. The semi-metal layer 30 is disposed on the upper surface of the metal sulfide layer 20. With continuous reference to FIG. 1, the semi-metal layer 30 is disposed between the metal sulfide layer 20 and the barrier layer 40, and the metal sulfide layer 20 is connected with a lower surface of the first dielectric layer 12.

In the embodiments of the disclosure, a radial dimension of the first conductive hole 131 is set to be larger than a radial dimension of the second conductive hole 132 to increase a contact area between the semi-metal layer 30 and the metal sulfide 20, thereby further reducing the contact resistance.

In some embodiments, in S103, forming a metal sulfide layer 20 covering a bottom wall of the conductive contact hole 13 in the conductive contact hole 13 includes the following operations.

In S1031, a metal sulfide layer 20 is formed on the base 10. The metal sulfide layer 20 covers an upper surface of the base 10 and an innerwall of the conductive contact hole 13.

Figure 4:
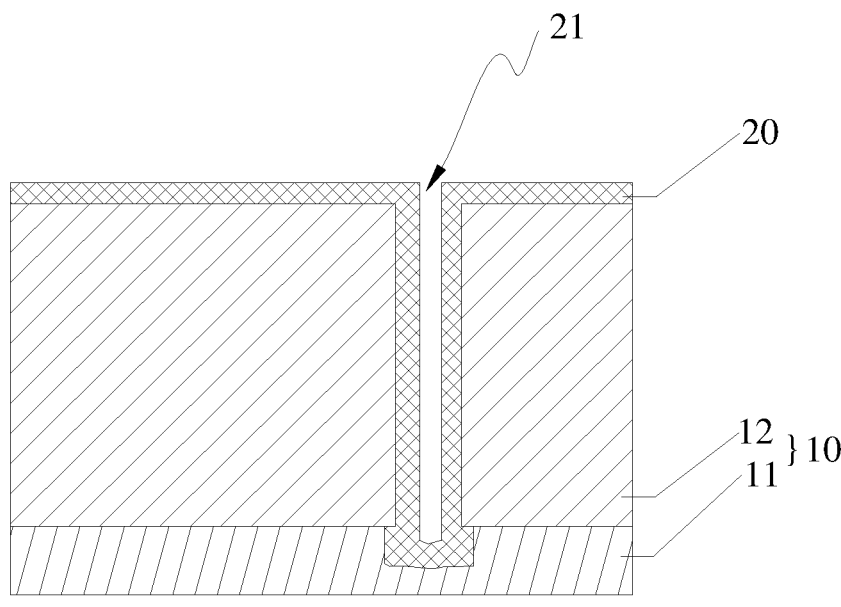
FIG. 4 is a third structural diagram of semiconductor structures according to an exemplary embodiment.

The metal sulfide layer 20 is formed on the base 10 by deposition. With reference to FIG. 4, the metal sulfide layer 20 covers the innerwall of the conductive contact hole 13 and the upper surface of the first dielectric layer 12, and defines a first deposition hole 21. As can be seen from FIG. 4, the conductive contact hole 13 includes the first conductive hole 131 and the second conductive hole 132 that are interconnected with each other. It is to be understood that the metal sulfide layer 20 covers the bottom wall and the sidewall of the first conductive hole 131 and the sidewall of the second conductive hole 132, respectively.

In S1033, a removal process is performed with the metal sulfide layer 20 covering the surface of the substrate 1/ being retained.

With reference to FIG. 7, the metal sulfide layer 20 formed on the first dielectric layer 12 is removed by a removal process to obtain the metal sulfide layer 20 covering the surface of the substrate 11.

In some embodiments, in S1031, after the metal sulfide layer 20 is formed on the base 10, the method further includes the following operation.

In S1035, a first sacrificial layer 60 covering the metal sulfide layer 20 is formed.

Figure 5:
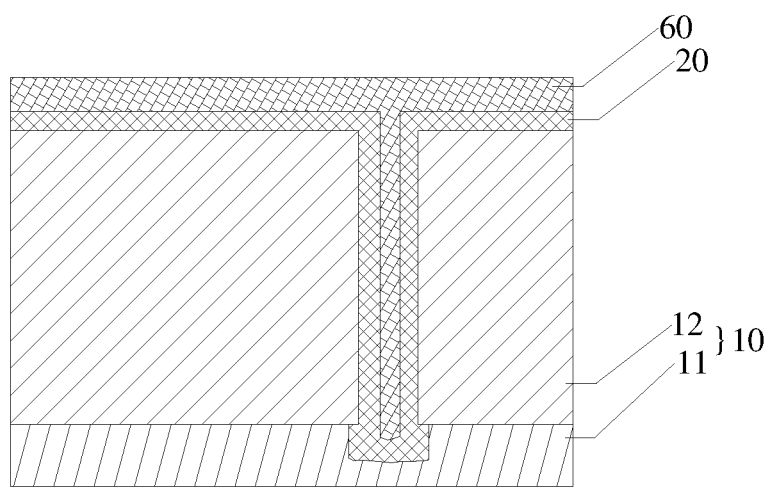
FIG. 5 is a fourth structural diagram of semiconductor structures according to an exemplary embodiment.

With reference to FIG. 5, the first sacrificial layer 60 is formed on the base 10 by deposition. The formed first sacrificial layer 60 covers the innerwall of the first deposition hole 21 and extends toward the outer edge of the base 10 from the opening of the first deposition hole 21, so as to cover the upper surface of the metal sulfide layer 20. The material of the first sacrificial layers 60 includes, but is not limited to, an oxide.

In the embodiments of the disclosure, during the semiconductor fabrication, the first sacrificial layer 60 covering the metal sulfide layer 20 is formed, so that the damage to the metal sulfide layer 20 during etching back the metal sulfide layer 20 can be avoided.

In some embodiments, in S1033, performing a removal process with the metal sulfide layer 20 covering the surface of the substrate 11 being retained includes the following operations.

In S1034, the first sacrificial layer 60 and the metal sulfide layer 20 formed on the first dielectric layer 12 are removed, to maintain the metal sulfide layer 20 formed on the surface of the substrate 11. Reference is made to FIG. 7, which illustrates the metal sulfide layer 20 formed on the base.

In some embodiments, in S1034, removing the first sacrificial layer 60 and the metal sulfide layer 20 formed on the first dielectric layer 12 with the metal sulfide layer 20 formed on the surface of the substrate 11 being retained include the following operations.

In S10341, a patterned first mask layer 70 is formed on a surface of the first sacrificial layer 60. The first mask layer 70 defines a first etching window 71.

Figure 6:
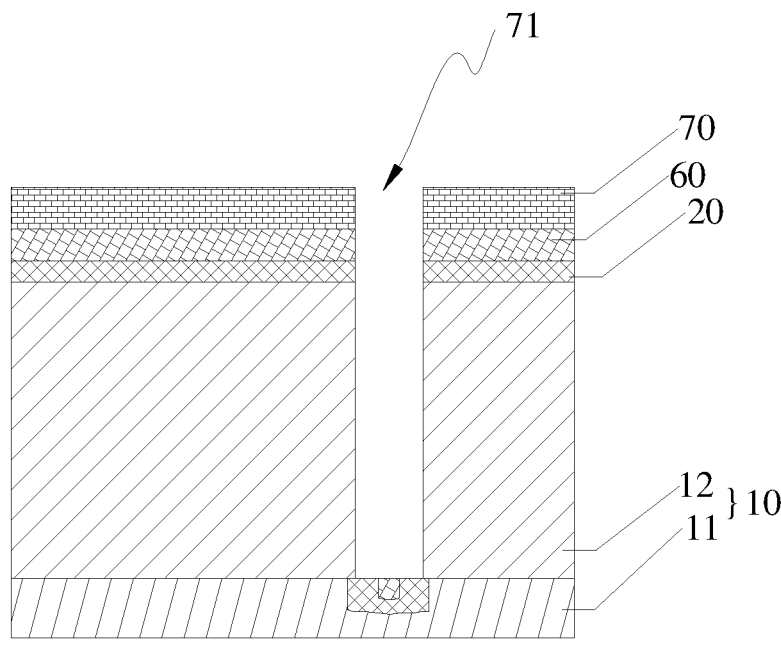
FIG. 6 is a fifth structural diagram of semiconductor structures according to an exemplary embodiment.

The patterned first mask layer 70 may be manufactured by etching a mask layer. With reference to FIG. 6, the patterned first mask layer 70 is formed with the first etching window 71; and the first etching window 71 is adapted to a dimension of the conductive contact hole 13. The first etching windows 71 with different dimensions may be formed on the first mask layer 70 as needed to adapt to the conductive contact holes 13 of different sizes.

In S10342, etching back process is performed according to the first etching window 71 to etch off the metal sulfide layer 20 and the first sacrificial layer 60 in the second conductive hole 132 until a remaining part of the metal sulfide layer 20 and the first sacrificial layer 60 is flush with the upper surface of the substrate.

The upper surface of the substrate 11 serves as a stop interface. It is to be understood that the upper surface of the substrate 11 is the surface connected with the lower surface of the first dielectric layer 12. The metal sulfide layer 20 and the first sacrificial layer 60 in the second conductive hole 132 are back etched.

In S10343, the metal sulfide layer 20, the first sacrificial layer 60 and the first mask layer 70 on the first dielectric layer 12, and the first sacrificial layer 60 on the metal sulfide layer 20 at the substrate 11 are removed.

The metal sulfide layer 20, the first sacrificial layer 60 and the first mask layer 70 on the first dielectric layer 12 and the first sacrificial layer 60 on the metal sulfide layer 20 at the substrate 11 are removed by a removal process, including but not limited to wet cleaning. Reference is made to FIG. 7, which shows the morphology of the semiconductor after the removal process.

In some embodiments, in S105, forming a semi-metal layer 30 covering an exposed surface of the metal sulfide layer 20 includes the following operations.

In S1051, a semi-metal layer 30 is formed on the base 10. The semi-metal layer 30 covers the upper surface of the base 10, the innerwall of the conductive contact hole 13, and the surface of the metal sulfide layer 20.

Figure 8:
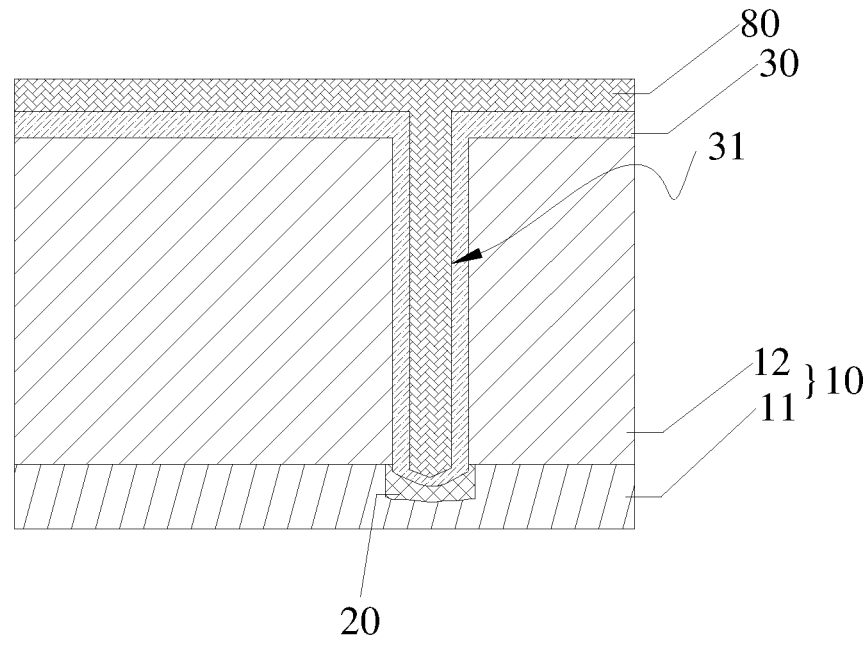
FIG. 8 is a seventh structural diagram of semiconductor structures according to an exemplary embodiment.

The semi-metal layer 30 is formed on the base 10 by deposition. With reference to FIG. 8, the semi-metal layer 30 covers the inner wall of the second conductive hole 132, the exposed surface of the metal sulfide layer 20 and the upper surface of the first dielectric layer 12; and the semi-metal layer 30 defines a second deposition hole 31.

In S1053, a second sacrificial layer 80 covering the semi-metal layer 30 is formed.

The second sacrificial layer 80 is formed on the base 10 by deposition. With reference to FIG. 8, the formed second sacrificial layer 80 fills the second deposition hole 31 and covers the upper surface of the semi-metal layer 30.

Figure 10:
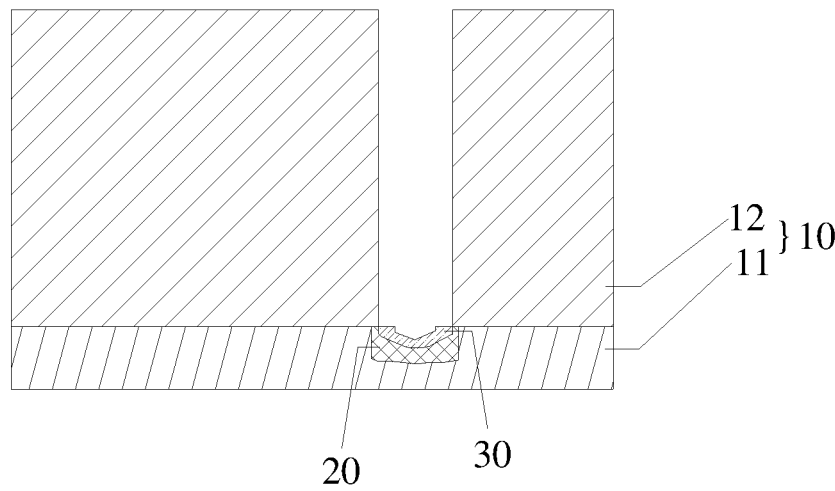
FIG. 10 is a ninth structural diagram of semiconductor structures according to an exemplary embodiment.

In S1055, the second sacrificial layer 80 and the semi-metal layer 30 formed on the first dielectric layer 12 are removed. With reference to FIG. 10, after the second sacrificial layer 80 and the semi-metal layer 30 formed on the first dielectric layer 12 are removed, the semi-metal layer 30 is formed on the surface of the metal sulfide layer 20.

In some embodiments, in S1055, removing the second sacrificial layer 80 and the semi-metal layer 30 formed on the first dielectric layer 12 includes the following operations.

In S10551, a patterned second mask layer 90 is formed on a surface of the second sacrificial layer 80. The second mask layer 90 defines a second etching window 91.

Figure 9:
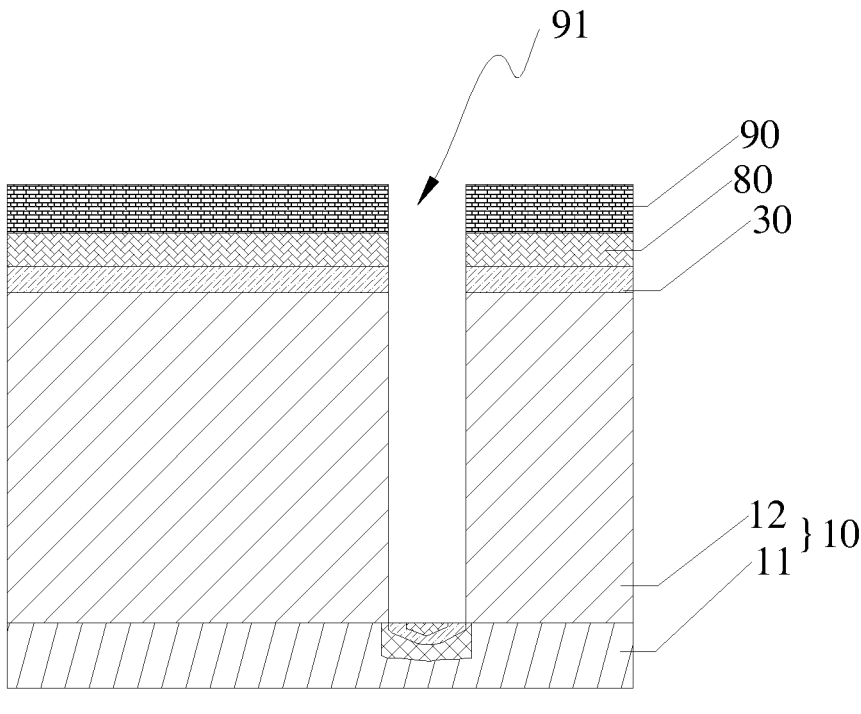
FIG. 9 is an eighth structural diagram of semiconductor structures according to an exemplary embodiment.

The patterned second mask layer 90 may be manufactured by etching a mask layer. With reference to FIG. 9, the patterned first mask layer 90 is formed with the second etching window 91; and the second etching window 91 has a dimension adapted to the dimension of the conductive contact hole 13. The second etching windows 91 of different sizes may be formed on the second mask layer 90 as needed to adapt to the conductive contact holes 13 of different sizes.

In S10552, etching back process is performed according to the second etching window 91 with the substrate 11 as a stop layer, to etch off the semi-metal layer 30 and the second sacrificial layer 80 in the second conductive hole 132.

The upper surface of the substrate 11 serves as a stop interface. It is to be understood that the upper surface of the substrate 11 is the surface connected with the lower surface of the first dielectric layer 12. The semi-metal layer 30 and the second sacrificial layer 80 in the second conductive hole 132 are back etched.

In S10553, the semi-metal layer 30, the second sacrificial layer 80 and the second mask layer 90 on the first dielectric layer 12, and the second sacrificial layer 80 on the semi-metal layer 30 are removed.

The semi-metal layer 30, the second sacrificial layer 80, and the second mask layer 90 on the first dielectric layer 12, as well as the second sacrificial layer 80 on the semi-metal layer 30 of the substrate 11 are removed by a removal process, including but not limited to wet cleaning. Reference is made to FIG. 10, which shows the morphology of the semiconductor after the removal process.

In some embodiments, in S107, forming a barrier layer 40 on the base 10, in which the barrier layer 40 covers a surface of the semi-metal layer 30 and a sidewall of the conductive contact hole 13 includes the following operation.

The barrier layer 40 is formed on the base 10 by deposition. The material of the barrier layer 40 is titanium nitride. With reference to FIG. 1, the barrier layer 40 covers an inner wall of the second conductive hole 132 and the exposed surface of the semi-metal layer 30.

In some embodiments, in S109, filling a conductive material in an accommodation hole 41 delimited by the barrier layer 40, so as to form a conductive contact structure 50 includes the following operation.

A conductive material fills the accommodation hole 41 (shown in FIG. 11) by deposition. The conductive material is tungsten. With reference to FIG. 1, it can be seen from FIG. 1 that the conductive material fills up the accommodation hole 41.

In some embodiments, the formed barrier layer 40 covers the surface of the semi-metal layer 30 and the sidewall of the conductive contact hole 13, the formed barrier layer 40 further extends from the opening of the conductive contact hole 13 to the outer edge of the substrate 10, so as to cover the upper surface of the base 10. It is to be understood that, with reference to FIG. 11, the upper surface of the base 10 is the upper surface of the first dielectric layer 12.

Figure 11:
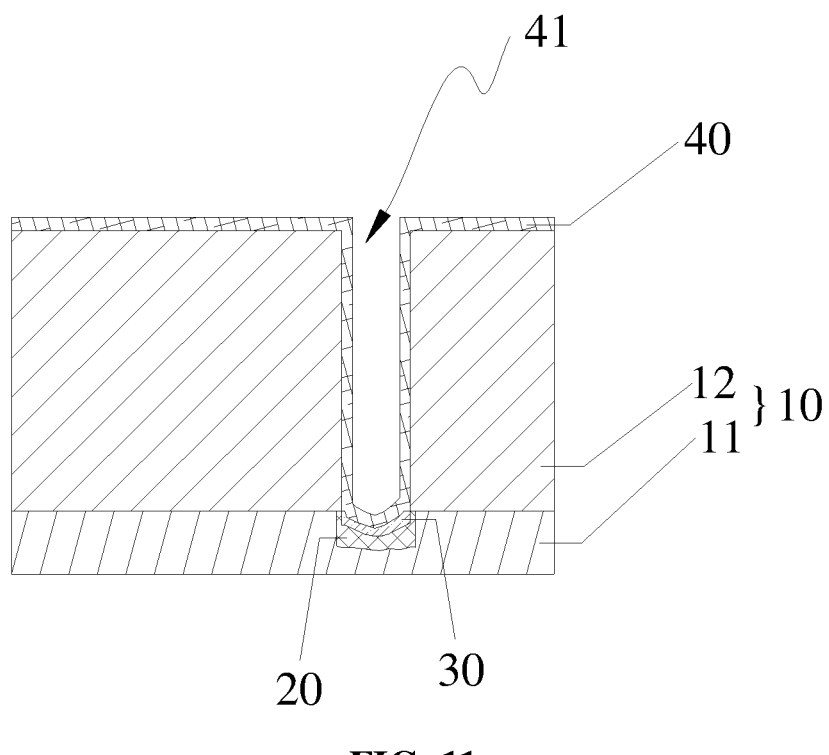
FIG. 11 is a tenth structural diagram of semiconductor structures according to an exemplary embodiment.

With reference to FIG. 11, it can be seen from FIG. 11 that after the barrier layer 40 is formed in the conductive contact hole 13, the barrier layer 40 is continuously deposited on the upper surface of the first dielectric layer 12. The formed barrier layer 40 covers the upper surface of the first dielectric layer 12.

In some embodiments, the formed conductive contact structure 50 fills the accommodation hole 41 and extends from the opening of the accommodation hole 41 toward the outer edge of the base 10 to cover the upper surface of the barrier layer 40.

With reference to FIG. 12, it can be seen from FIG. 12 that after the conductive contact structure 50 is formed in the accommodation hole 41, the conductive material is continuously deposited on the upper surface of the barrier layer 40, so that the formed conductive contact structure 50 covers the upper surface of the barrier layer 40.

In some embodiments, after the first sacrificial layer 60 at the first conductive hole 131 is removed, the method further includes the following operation. A removal process is performed on the metal sulfide layer 20 to form a concave morphology on the upper surface of the metal sulfide layer 20.

With reference to FIG. 7, the concave morphology may be formed on the upper surface of the metal sulfide layer 20 by performing a removal process on the exposed surface of the metal sulfide layer 20.

In the embodiment of the disclosure, a concave morphology is formed on the upper surface of the metal sulfide layer 20, such that the contact area between the semi-metal layer 30 and the barrier layer 40 or between the barrier layer 40 and the conductive contact structure 50 is increased, further reducing the contact resistance.

According to the third aspect of the embodiments of the disclosure, a memory is provided. The memory includes a semiconductor structure according to the above embodiments.

It is to be understood that, the semiconductor structure fabricated according to the embodiments as described above can be applied to a variety of integrated circuit (IC) fabrication. The IC according to the disclosure is, for example, a memory circuit such as a random access memory (RAM), a dynamic RAM (DRAM), a synchronous DRAM (SDRAM), a static RAM (SRAM), or a read-only memory (ROM), etc. The IC according to the disclosure may also be a logic device, such as a programmable logic array (PLA), an application specific integrated circuit (ASIC), a combined DRAM logic integrated circuit (buried DRAM), a radio frequency circuit, or any other circuit device. The IC chip according to the disclosure may be used in, for example, a consumer electronic product such as a personal computer, a portable computer, a game machine, a cellular phone, a personal digital assistant, a video camera, a digital camera, a mobile phone and other electronic product.

In the description of the specification, the descriptions of the reference terms "some embodiments," "other embodiments," "ideal embodiments," or the like mean that specific features, structures, materials, or features described in conjunction with the embodiments or examples are included in at least one embodiment or example of the disclosure. In this specification, the schematic expressions of the above terms do not necessarily refer to a same embodiment or example.

The technical features of the above-mentioned embodiments may be arbitrarily combined. For the sake of concise description, not all possible combinations of the technical features of the above-mentioned embodiments are described. However, as long as there is no contradiction in the combinations of these technical features, they should be considered as the scope described in this specification.

The above-mentioned embodiments only represent several embodiments of the present disclosure, and the description thereof is relatively specific and detailed, but should not be construed as a limitation on the scope of the patent application. It should be noted that for those skilled in the art, without departing from the concept of the present application, a number of modifications and improvements may be made, which all fall within the scope of protection of the present application. Therefore, the scope of protection of the patent application shall be subject to the attached claims.

The invention claimed is:

1. A semiconductor structure, comprising:
   a base provided with a conductive contact hole;
   a metal sulfide layer formed in the conductive contact hole and covering a bottom wall of the conductive contact hole;
   a semi-metal layer formed on a surface of the metal sulfide layer;
   a barrier layer covering a surface of the semi-metal layer and a sidewall of the conductive contact hole; and
   a conductive contact structure disposed in an accommodation hole delimited by the barrier layer.

2. The semiconductor structure of claim 1, wherein
   the base comprises a substrate and a first dielectric layer formed on the substrate, and the conductive contact hole penetrates the first dielectric layer and extends into the substrate;
   wherein the conductive contact hole comprises a first conductive hole formed in the substrate and a second conductive hole formed in the first dielectric layer, and a radial dimension of the first conductive hole is larger than a radial dimension of the second conductive hole.

3. The semiconductor structure of claim 1, wherein a material of the metal sulfide layer is molybdenum sulfide or tungsten sulfide, and a material of the semi-metal layer comprises a semi-metal element of Group VA.

4. The semiconductor structure of claim 1, wherein
   the barrier layer covers a surface of the semi-metal layer and a sidewall of the conductive contact hole, and covers an upper surface of the base; the conductive contact structure fills the accommodation hole and covers an upper surface of the barrier layer.

5. The semiconductor structure of claim 1, wherein
   a radial dimension of the metal sulfide layer is larger than a radial dimension of the conductive contact structure; and an upper surface of the metal sulfide layer has a concave morphology.

6. A fabrication method for a semiconductor structure, comprising:
   providing a base, a conductive contact hole being formed in the base;
   forming a metal sulfide layer covering a bottom wall of the conductive contact hole in the conductive contact hole;
   forming a semi-metal layer covering an exposed surface of the metal sulfide layer;
   forming a barrier layer on the base, the barrier layer covering a surface of the semi-metal layer and a sidewall of the conductive contact hole; and
   filling a conductive material in an accommodation hole delimited by the barrier layer to form a conductive contact structure.

7. The fabrication method for a semiconductor structure of claim 6, wherein forming a conductive contact hole in the base comprises:

treating the base by an etching process to form the conductive contact hole in the base.

8. The fabrication method for a semiconductor structure of claim 6, wherein the base comprises a substrate and a first dielectric layer formed on the substrate, and the conductive contact hole penetrates the first dielectric layer and extends into the substrate to expose a surface of the substrate;

wherein the conductive contact hole comprises a first conductive hole formed in the substrate and a second conductive hole formed in the first dielectric layer, and a radial dimension of the first conductive hole is larger than a radial dimension of the second conductive hole.

9. The fabrication method for a semiconductor structure of claim 8, wherein forming a metal sulfide layer covering a bottom wall of the conductive contact hole in the conductive contact hole comprises:

forming a metal sulfide layer covering an upper surface of the base and an innerwall of the conductive contact hole on the substrate; and performing a removal process with the metal sulfide layer covering the surface of the substrate being retained.

10. The fabrication method for a semiconductor structure of claim 9, further comprising:

forming a first sacrificial layer covering the metal sulfide layer after forming the metal sulfide layer on the base.

11. The fabrication method for a semiconductor structure of claim 10, wherein performing a removal process with the metal sulfide layer covering the surface of the substrate being retained comprises:

removing the first sacrificial layer and the metal sulfide layer formed on the first dielectric layer to maintain the metal sulfide layer formed on the surface of the substrate.

12. The fabrication method for a semiconductor structure of claim 11, wherein removing the first sacrificial layer and the metal sulfide layer formed on the first dielectric layer with the metal sulfide layer formed on the surface of the substrate being retained comprises:

forming a patterned first mask layer on a surface of the first sacrificial layer, the first mask layer defining a first etching window;

performing etching back process according to the first etching window to etch the metal sulfide layer and the first sacrificial layer in the second conductive hole until a remaining part of the metal sulfide layer and the first sacrificial layer is flush with an upper surface of the substrate; and removing the metal sulfide layer, the first sacrificial layer and the first mask layer on the first dielectric layer, and the first sacrificial layer in the first conductive hole.

13. The fabrication method for a semiconductor structure of claim 11, wherein forming a semi-metal layer covering an exposed surface of the metal sulfide layer comprises:

forming the semi-metal layer on the base, the semi-metal layer covering the upper surface of the base, the innerwall of the conductive contact hole and the surface of the metal sulfide layer;

forming a second sacrificial layer covering the semi-metal layer, and removing the second sacrificial layer and the semi-metal layer formed on the first dielectric layer.

14. The fabrication method for a semiconductor structure of claim 13, wherein removing the second sacrificial layer and the semi-metal layer formed on the first dielectric layer comprises:

forming a patterned second mask layer on a surface of the second sacrificial layer, the second mask layer defining a second etching window;

performing etching back process according to the second etching window to etch the semi-metal layer and the second sacrificial layer in the second conductive hole until a remaining part of the semi-metal layer and the second sacrificial layer is flush with the upper surface of the substrate; and removing the semi-metal layer, the second sacrificial layer and the second mask layer on the first dielectric layer, and the second sacrificial layer on the semi-metal layer.

15. The fabrication method for a semiconductor structure of claim 12, further comprising:

performing a removal process on the metal sulfide layer to form a concave morphology on the upper surface of the metal sulfide layer after removing the first sacrificial layer at the first conductive hole.

16. A memory, comprising the semiconductor structure of claim 1.

* * * * *